United States Patent
Xue et al.

(10) Patent No.: US 11,067,615 B2
(45) Date of Patent: Jul. 20, 2021

(54) PORTABLE THERMOELECTRIC POTENTIAL DETECTOR

(71) Applicants: SUZHOU NUCLEAR POWER RESEARCH INSTITUTE CO., LTD, Jiangsu (CN); CHINA GENERAL NUCLEAR POWER GROUP, Guangdong (CN); CGN POWER CO., LTD., Guangdong (CN)

(72) Inventors: Fei Xue, Jiangsu (CN); Fangjie Shi, Jiangsu (CN); Yumeng Yang, Jiangsu (CN); Wenxin Ti, Jiangsu (CN); Guangyu Yang, Jiangsu (CN); Fei Huang, Jiangsu (CN)

(73) Assignees: SUZHOU NUCLEAR POWER RESEARCH INSTITUTE CO., LTD, Suzhou (CN); CHINA GENERAL NUCLEAR POWER GROUP, Shenzhen (CN); CGN POWER CO., LTD., Shenzhen (CN)

( * ) Notice: Subject to any disclaimer, the term of this patent is extended or adjusted under 35 U.S.C. 154(b) by 30 days.

(21) Appl. No.: 16/462,574

(22) PCT Filed: Aug. 3, 2018

(86) PCT No.: PCT/CN2018/098453
§ 371 (c)(1),
(2) Date: May 21, 2019

(87) PCT Pub. No.: WO2019/184177
PCT Pub. Date: Oct. 3, 2019

(65) Prior Publication Data
US 2020/0241061 A1    Jul. 30, 2020

(30) Foreign Application Priority Data

Mar. 26, 2018 (CN) .......................... 201810250607.3

(51) Int. Cl.
*G01R 29/12* (2006.01)
*G01K 7/18* (2006.01)
(Continued)

(52) U.S. Cl.
CPC ............... *G01R 29/12* (2013.01); *G01K 7/18* (2013.01); *G01K 15/005* (2013.01); *G01L 25/00* (2013.01); *G01R 19/0084* (2013.01)

(58) Field of Classification Search
None
See application file for complete search history.

(56) References Cited

U.S. PATENT DOCUMENTS 5,969,238 A * 10/1999 Fischer ................ G01B 21/085
  73/105
2016/0273976 A1 * 9/2016 Lugli .................... G01K 15/007

FOREIGN PATENT DOCUMENTS

CN    2016-01014 Y  * 12/2015  ............. G01R 19/00
CN    105158542 A   * 12/2015  ............. G01R 19/00
(Continued)

OTHER PUBLICATIONS

CN 105158542 A, Jiang et al (published Dec. 16, 2015), Google Translation (Year: 2015).*
(Continued)

*Primary Examiner* — Jermele M Hollington
*Assistant Examiner* — Suresh K Rajaputra (57) ABSTRACT

The present application discloses a portable thermoelectric potential detector, which is small in size and easy to carry. A portable thermoelectric potential detector includes a test fixture for fixing a sample to be tested, a probe assembly unit for detecting the sample to be tested, and a collection and control unit for controlling detecting of the probe assembly and collecting a voltage signal of the probe assembly; the probe assembly unit includes two probe assemblies, each
(Continued)

probe assembly includes a probe for loading on the surface of the sample to be tested and a linear motor for driving the probe to move and load on the surface of the sample to be tested; the collection and control unit is electrically connected to the linear motor, and is further configured to transmit a first control signal for controlling a moving distance and a loading force of the linear motor.

11 Claims, 6 Drawing Sheets

(51) Int. Cl.
*G01K 15/00* (2006.01)
*G01L 25/00* (2006.01)
*G01R 19/00* (2006.01)

(56) References Cited

FOREIGN PATENT DOCUMENTS

| CN | 2016-40219 | * | 6/2016 | ............ | G01R 19/00 |
| CN | 105699619 A | * | 6/2016 | ............ | G01R 19/00 |

OTHER PUBLICATIONS

CN 105699619 A, Han et al (published Jun. 22, 2016), Google Translation (Year: 2016).*
CN 105158542 A, Jiang et al (published Dec. 16, 2015), Google Translation (Year: 2015); provided with the previous office action.*
CN 105699619 A, Han et al (published Jun. 22, 2016), Google Translation (Year: 2016); provided with the previous office action.*

* cited by examiner

PORTABLE THERMOELECTRIC POTENTIAL DETECTOR

TECHNICAL FIELD

The present application relates to the field of nondestructive testing of materials, and more specially, relates to a portable thermoelectric potential detector used in the field of nuclear power plant.

BACKGROUND

After long-term operation, the mechanical properties of the materials of the steel for key equipment in nuclear power plants will change due to aging effects such as heat aging and neutron irradiation. For example, cast austenitic stainless steel used in the main pipeline of the circuit, low-alloy high-strength steel bolts for fastening, and precipitation hardened stainless steel for valve stems, etc., will have an increase in strength and hardness and an decrease in plasticity and toughness during long-term service at the ambient temperature of the pressurized water reactor, that is heat aging, leading to degradation of material properties and potential safety hazards; In addition, the embrittlement of reactor pressure vessel (RPV) by neutron irradiation during service is one of the most important aging mechanisms, and it is also one of the factors limiting the safe operation of power plants.

RPV and the main pipelines are important components of nuclear power plants, and are not suitable for destructive testing from the perspective of pressure boundary integrity. Therefore, the evaluation of its performance generally uses calculation and simulation methods, lacking on-site direct detection data and methods. Non-destructive testing based on existing field data and laboratory simulation data has received extensive attention. The change in mechanical properties of metal materials (aging deterioration) is usually accompanied by changes in electrical properties (thermoelectric potential). Therefore, by measuring the change in thermoelectric potential of the material after service, the mechanical properties of the material can be indirectly characterized, and non-destructive testing of the material is completed. The thermoelectric potential method can be used to evaluate the material embrittlement caused by neutron irradiation and heat aging in the nuclear power plant, so as to provide reference for the aging management of the power station.

The measurement of the metal thermoelectric potential is based on the Seebeck effect. The Seebeck effect is that in a circuit composed of two metals A, B or different parts of the same metal, due to the different temperatures of the two contact points, a current is generated, which is called a temperature difference current, and has a corresponding potential difference $\Delta V_{AB}$. It has been found that the potential difference $\Delta V_{AB}$ is proportional to the temperature difference $\Delta T$, and its ratio $S_{AB}=\Delta V_{AB}/\Delta T$ is a function of the temperature difference and the two materials, and is completely independent of the shape, connection mode, etc. of the material and has linear superposition. Therefore, $S_{AB}$ is a basic property of materials, called the Seebeck coefficient of materials, also known as thermoelectric potential (TEP).

A metal thermoelectric potential detector for field use is disclosed in Chinese patent CN201510546773, which is composed of measurement equipment and control equipment. The measurement equipment is provided with a first probe assembly movable in the X-axis direction and the Z-axis direction, a second probe assembly movable in the Z-axis direction, and corresponding driving mechanisms, and the control equipment is mainly used for controlling the temperature and displacement of the probe. The detector has certain portability and automation level, but has the following problems: 1. The detector adopts electric sliding table and ball screw structure to control the feeding in the X-axis and Z-axis directions, and the complex structure and the large volume make it not convenient for on-site use; 2, it does not have a probe cooling device, making the probe need to be naturally cooled with a low speed during the actual use, affecting the measurement efficiency; 3, the force sensor in the probe is installed in the instrument box together with the electric slide, force calibration is not possible without disassembly; 4, a commercial nanovoltmeter is used for the temperature and voltage measurement, which is large in size and inconvenient to carry.

A metal thermoelectric potential measuring instrument is disclosed in Chinese patent CN105699619A which controls the first probe assembly and the second probe assembly to move to the metal sample to be tested and close to the metal sample to be tested by rotating the screw handle of the feeding mechanism. It can be seen that the metal thermoelectric potential measuring instrument drives the probe to move by a manual method, and has a complicated structure and a large volume.

In view of at least one of the above problems, it is necessary to propose an improved portable thermoelectric potential detector.

SUMMARY

In view of the above problems, an object of the present application is to provide a portable thermoelectric potential detector which is small in size and easy to carry.

In order to achieve the above object, the present application adopts the following technical solutions:

A portable thermoelectric potential detector, comprising a test fixture for fixing a sample to be tested, a probe assembly unit for detecting the sample to be tested, and a collection and control unit for controlling detecting of the probe assembly and collecting a voltage signal of the probe assembly;

the probe assembly unit comprises two probe assemblies, each probe assembly includes a probe for loading on the surface of the sample to be tested and a linear motor for driving the probe to move and load on the surface of the sample to be tested; an output of the linear motor is connected to the probe;

the collection and control unit is electrically connected to the linear motor, and is further configured to transmit a first control signal for controlling a moving distance and a loading force of the linear motor.

In some embodiments, the collection and control unit comprises an FPGA microprocessor.

In some embodiments, the probe assembly further includes a heater for heating the probe and a temperature sensor for measuring a temperature of the probe;

the collection and control unit is electrically connected to the temperature sensor, and is further configured to receive temperature information measured by the temperature sensor, and send a second control signal for adjusting heating temperature to the heater according to the temperature information;

the heater is electrically connected to the collection and control unit, and is configured to adjust the heating temperature according to the second control signal.

In some embodiments, the temperature sensor is a platinum electrode embedded in the probe.

In some embodiments, the probe assembly unit includes an assembly housing, a motor mount fixedly disposed within the assembly housing; the linear motors of the two probe assemblies are disposed on the motor mount respectively, the probes of the two probe assemblies have a minimum pitch of 40 mm.

In some embodiments, the test fixture includes a desktop fixture for fixing a sample with a small diameter and a pipeline-type fixture for fixing a sample with a large diameter;

the desktop fixture includes a first bracket, a pair of connecting members disposed on the first bracket, the assembly housing is detachably and slidably coupled between the pair of connecting members;

the pipeline-type fixture includes a second bracket, a pair of connecting members disposed on the second bracket, the assembly housing is detachably and slidably coupled between the pair of connecting members.

In some embodiments, the desktop fixture further includes a support block fixedly disposed on the first bracket, a groove for placing the sample to be tested is opened on the support block;

and/or, the pipeline-type fixture includes a fixing equipment for fixing the sample to be tested under the second bracket; the second bracket includes a verticality adjusting plate and a bottom plate; the connecting members are disposed on the verticality adjusting plate; the fixing equipment is connected with the bottom plate; the verticality adjusting plate and the bottom plate are movably connected by a plurality of mutually spaced screws.

In some embodiments, the portable thermoelectric potential detector further includes a calibration unit for performing thermoelectric potential calibration and/or pressure calibration to the probe assembly; the probe assembly is removably connected with the calibration unit; when the probe assembly is connected with the calibration unit, the probe assembly is in a calibration state.

In some embodiments, the calibration unit includes a force calibration assembly and/or a thermoelectric potential calibration assembly; the force calibration assembly includes a force sensor, which has a plug connected with a socket on the bottom of the probe assembly; the thermoelectric potential calibration assembly includes a standard copper rod, a material of which is the same as that of the probe.

In some embodiments, the portable thermoelectric potential detector further includes a probe cooling unit comprising a cooling module; the probe assembly is removably connected with the probe cooling unit; when the probe assembly is connected with the probe cooling unit, the probe assembly is in a cooling state.

The present application adopts the above technical solutions, and has the following advantages compared with the prior art:

the linear motor is adopted to drive the probe to move on to the sample to be tested; by adjusting the loading current of the linear motor, the pressure of the probe on the sample to be tested can be adjusted; such that the driving structure for driving the probe assembly is simplified, the volume is reduced, and it is easy to carry.

BRIEF DESCRIPTION OF THE DRAWINGS

In order to more clearly illustrate the technical solutions of the present application, the drawings used in the description of the embodiments will be briefly described below. It is obvious that the drawings in the following description are only some embodiments of the present application. For those skilled in the art, other drawings can be obtained according to these drawings without any creative work.

Wherein, 1, computer; 2, collection and control unit; 3, probe assembly unit; 4, test fixture; 5, calibration unit; 6, probe cooling unit;

- 31, terminal block; 32, assembly housing; 33, trapezoidal guide rail; 34, motor mount; 35, linear motor; 36, probe bracket; 37, heater; 38, probe; 39, wind cap; 310, connecting pin; 311, platinum electrode; 312, connecting socket;
- 41, first bracket; 411, connecting members; 412, connecting members; 42, locking handle; 421, locking portion; 422, hole; 43, support block; 44, sample to be tested;
- 45, second bracket; 451, connecting members; 452, connecting members; 453, verticality adjusting plate; 454, bottom plate; 46, locking handle; 47, screw; 48, strap; 49, pipeline to be tested;
- 51, plug; 52, force sensor; 53, housing;
- 54, standard copper rod; 55, support;
- 61, plug; 62, cooling module; 63, shell.

DETAILED DESCRIPTION OF THE PREFERRED EMBODIMENT

The preferred embodiments of the present application are described in detail below with reference to the accompanying drawings in order to make the advantages and features of the present application more readily understood by those skilled in the art. It is to be noted that the description of the embodiments is intended to facilitate the understanding of the application, but is not intended to limit the application. Further, the technical features involved in the various embodiments of the present application described below may be combined with each other as long as they do not constitute a conflict with each other.

Figure 1:
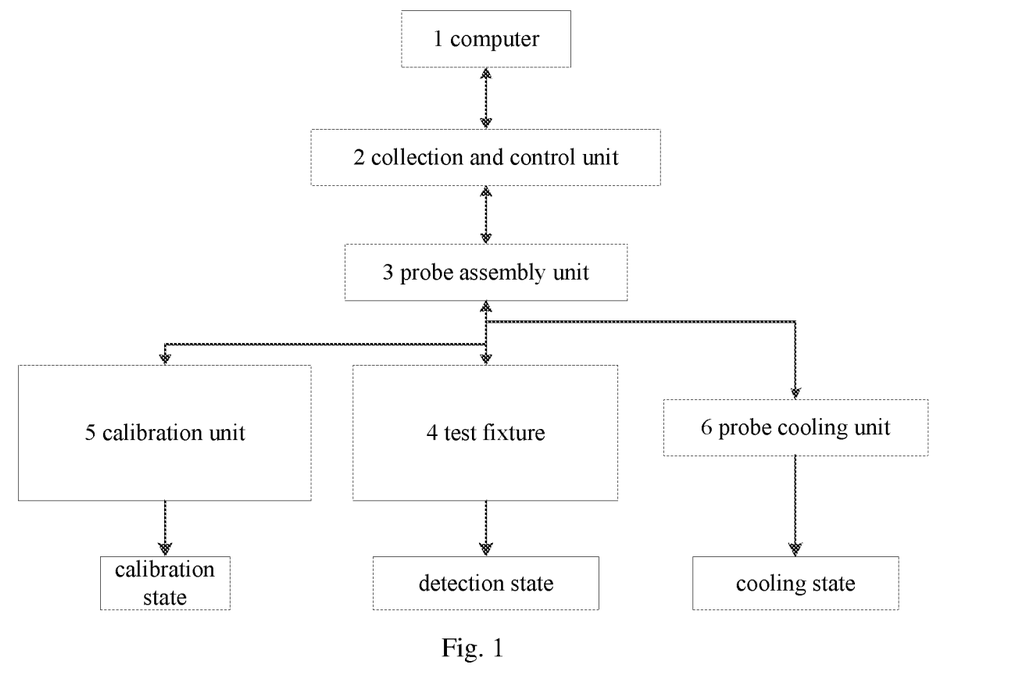
FIG. 1 is a block diagram showing the structure of a portable thermoelectric potential detector in accordance with the present application.

The embodiment provides a portable thermoelectric potential detector for performing metal thermoelectric potential detection on a nuclear power site for metal components in a nuclear power plant, such as a main pipe, an RPV, a fastening steel bolt, a valve stem, and the like, so as to evaluating material embrittlement due to neutron radiation and heat aging. Referring to FIG. 1, a portable thermoelectric potential detector includes a computer 1, a collection and control unit 2, a probe assembly unit 3, a test fixture 4, a calibration unit 5, and a probe cooling unit 6. Wherein, the computer 1 is equipped with test software; the test fixture 4 includes at least one of a desktop fixture and a pipeline-type fixture, and the present embodiment preferably includes the two of the desktop fixture and the pipeline-type fixture to fix small diameter parts and large diameter parts of the nuclear power site. The portable thermoelectric detector has three operating states, a detection state, a calibration state, and a cooling state. In the detection state, the probe assembly unit 3 is loaded on the sample to be tested to collect a voltage signal; in the calibration state, the probe assembly unit 3 and the calibration unit 5 are connected to perform thermoelectric potential calibration and pressure calibration; in the cooling state, the probe assembly unit 3 is connected to the probe cooling unit 6 to cool the probe quickly.

The collection and control unit 2, specifically using an FPGA microprocessor, is developed based on FPGA technology, and can complete the pressure and temperature control of the probe assembly, the temperature and voltage data collection of the probe. The power supply is small, thereby reducing the volume of the detector.

Figure 2A:
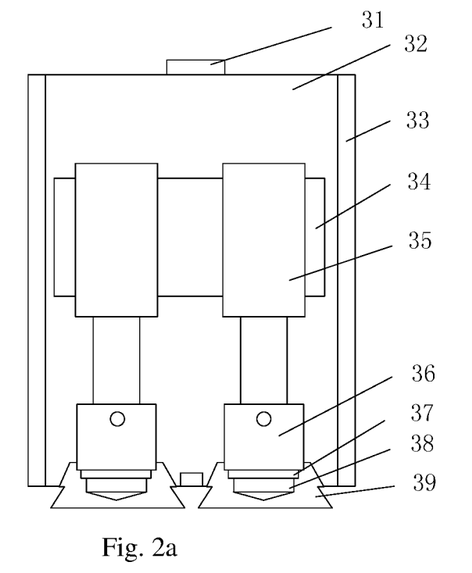
FIG. 2a is a schematic illustration of a probe assembly unit in accordance with the present application.
Figure 2B:
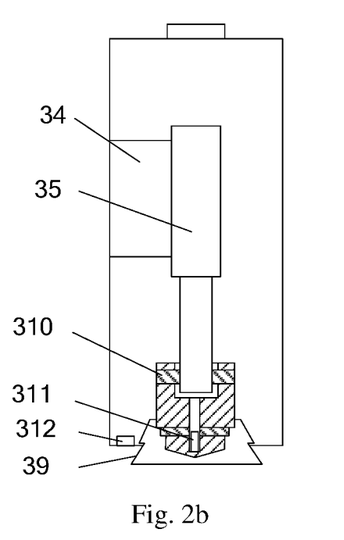
FIG. 2b is a cutaway view of a probe in accordance with the present application.

The probe assembly unit 3 includes two probe assemblies of identical construction. Referring to FIGS. 2a and 2b, the probe assembly unit 3 further includes an assembly housing 32, a motor mount 34 fixedly disposed within the assembly housing 32, and the two probe assemblies are movably disposed within the assembly housing 32. Each probe assembly includes a probe 38 for loading on the surface of the sample to be tested and a linear motor 35 for driving the probe 38 to move and load on the surface of the sample to be tested. The output of the linear motor 35 is connected to the probe 38. The linear motor 35 is specifically a high-precision micro stepping linear motor, and is a transmission device that directly converts electrical energy into linear motion mechanical energy without any intermediate conversion mechanism. The linear motors 35 of the two probe assemblies are spaced apart from each other on the motor mount 34 such that the probes 38 of the two probe assemblies have a minimum pitch of 40 mm.

The collection and control unit 2 and the two linear motors 35 are electrically connected. Specifically, the top of the assembly housing 32 has a terminal block 31 that is electrically connected to the two linear motors 35, respectively, and the terminal block 31 is connected to the collection and control unit 2 by a cable. The collection and control unit 2 is configured to synchronously transmit a first control signal for controlling the moving distance and the loading force of the linear motor 35 to the two linear motors 35, specifically, adjusting the moving distance of the linear motor 35 by adjusting the magnitude of the loading current of the linear motor 35; the linear motor 35 drives the probe 38 to move a corresponding distance in response to the first control signal and to load on the sample to be tested with the corresponding pressure. That is, the collection and control unit 2 has a function of controlling the pressure of the probe 38 on the sample to be tested by adjusting the current of the linear motor 35.

The probe 38 is specifically a copper probe, and the probe assembly further includes a probe bracket 36, a heater 37, and a wind cap 39. The probe bracket 36 is made of polytetrafluoroethylene and functions as insulation and heat preservation. The upper end portion of the polytetrafluoroethylene bracket is fixedly coupled to the projecting end of the linear motor 35 via the connecting pin 310; the lower end portion of the probe bracket 36 is fixedly coupled to the heater 37 and the wind cap 39. The heater 37 is specifically a ceramic heater 37, and the copper probe is disposed on a ceramic heater 37 for heating the copper probe. The wind cap 39 is a corrugated silicone rubber windbreak insulation cap that is placed around the copper probe to reduce the influence of the environment on the probe 38 during the measurement process.

The probe assembly unit 3 also includes a temperature sensor for measuring the temperature of the copper probe. The heater 37 and the temperature sensor are electrically connected to the collection and control unit 2 via the terminal block 31, respectively. The collection and control unit 2 is further configured to receive temperature information measured by the temperature sensor, and send a second control signal for adjusting the heating temperature to the heater 37 according to the temperature information; the heater 37 is configured to adjust the heating temperature according to the second control signal. The temperature sensor is specifically a platinum electrode 311 embedded in the copper probe.

The assembly housing 32 is provided with a guide rail, which is specifically a trapezoidal guide rail 33 for connecting with the test fixture 4 in a sliding fit. A connecting socket 312 for connecting with the force calibration assembly and the probe cooling unit 6 in a socket fit is also provided on the assembly housing 32.

Figure 3A:
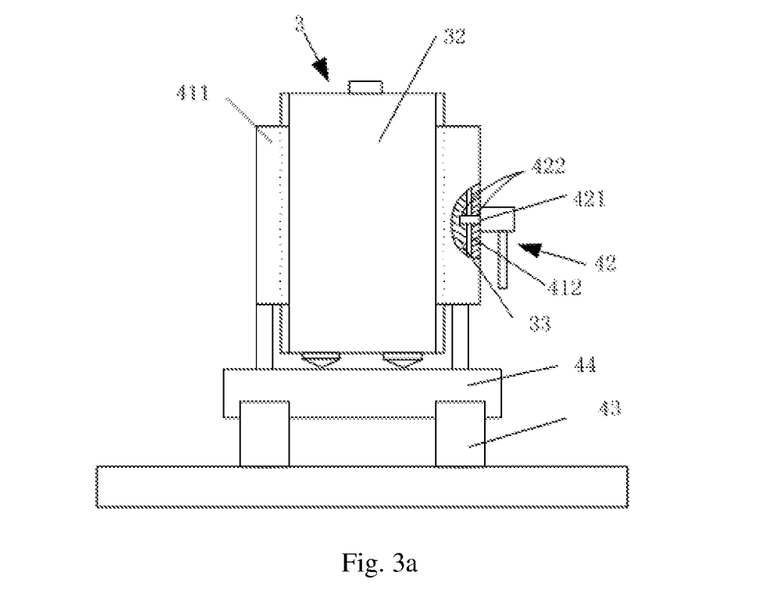
FIG. 3a is a front view of a desktop fixture in accordance with the present application.
Figure 3B:
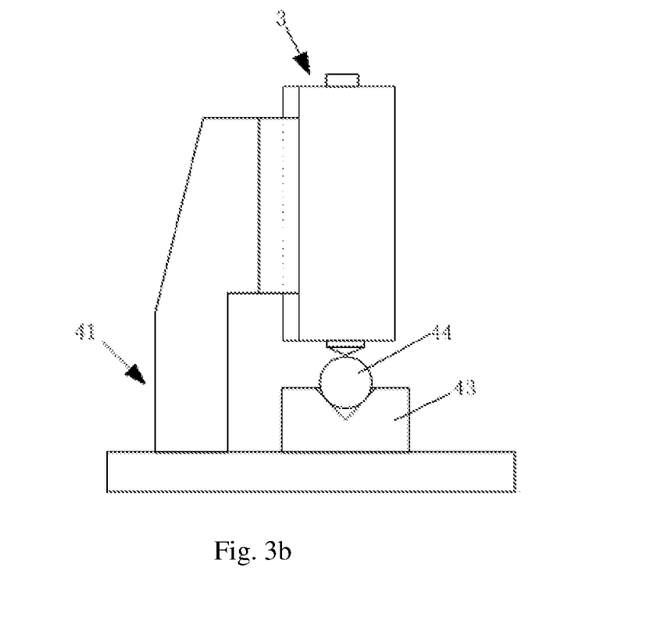
FIG. 3b is a side view of a desktop fixture in accordance with the present application.

FIGS. 3a and 3b show a desktop fixture. The desktop fixture includes a first bracket 41 and a support block 43 disposed on the first bracket 41. A pair of connecting members 411, 412 are spaced and oppositely disposed on the first bracket 41, and a space for accommodating and fixing the probe assembly unit 3 is formed between the pair of connecting members 411, 412. The assembly housing 32 of the probe assembly unit 3 is detachably and slidably coupled between the pair of connecting members 411, 412. The connecting members 411, 412 are specifically dovetail groove assemblies that slidably engage the trapezoidal guide rail 33 of the assembly housing 32. The desktop fixture further includes a locking mechanism for locking the assembly housing 32. Specifically, the locking mechanism includes locking handle 42 disposed on the first bracket 41 and one of the connecting member 412 and detachably coupled to the trapezoidal guide rail 33. The other connecting member 411 is fixedly connected to the first bracket 41. As shown in FIG. 3a, a hole 422 is opened on the right connecting member 412 and the right trapezoidal guide rail 33 to cooperate with the locking portion of the locking handle 42. The locking portion 421 of the locking handle 42 passes through the hole 422 on the right connecting members 411, 412 and is then inserted into the hole 422 of the right trapezoidal guide 33 to lock the assembly housing 32. The support blocks 43 are preferably a pair and are spaced apart from each other, and the support blocks 43 are disposed below the connecting members 411, 412 to ensure that the sample to be tested 44 placed on the support block 43 at the time of detection can be located directly below the pair of probes 38. Specifically, the support block 43 is provided with a groove for cooperating with the sample to be tested 44 to place the sample to be tested 44, and the sample to be tested 44 is placed in the groove to be fixed, and the shape of the groove is preferably a V shape as shown in the FIG. 3b. When detecting the sample having a small diameter, the locking handle 42 is loosened, and the assembly housing 32 of the probe assembly unit 3 is inserted between the pair of connecting members 411 and 412 from top to bottom, and the trapezoidal guide rail 33 and the connecting member 411, 412 cooperate to each other to allow the assembly housing 32 to slide downward, thereby adjusting the distance between the probe 38 and the sample to be tested 44. After the adjustment is in place, the locking handle 42 is tightened to fix the probe assembly unit 3.

Figure 4A:
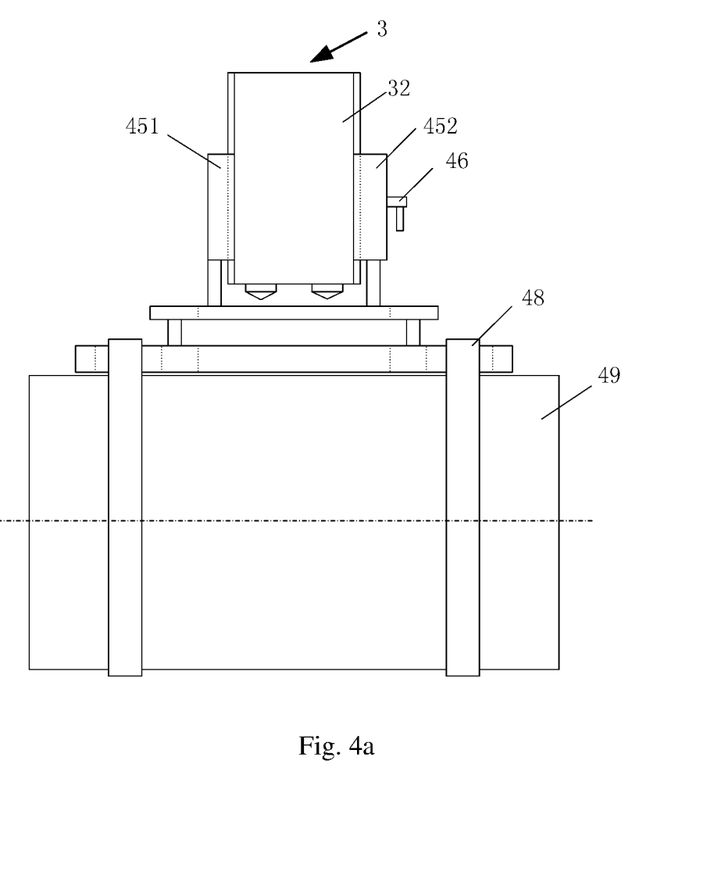
FIG. 4a is a front view of a pipeline-type fixture in accordance with the present application.
Figure 4B:
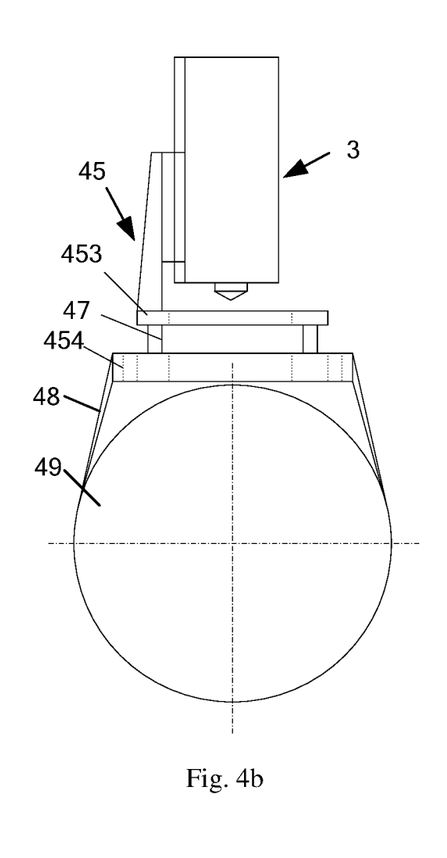
FIG. 4b is a side view of a pipeline-type fixture in accordance with the present application.
Figure 4C:
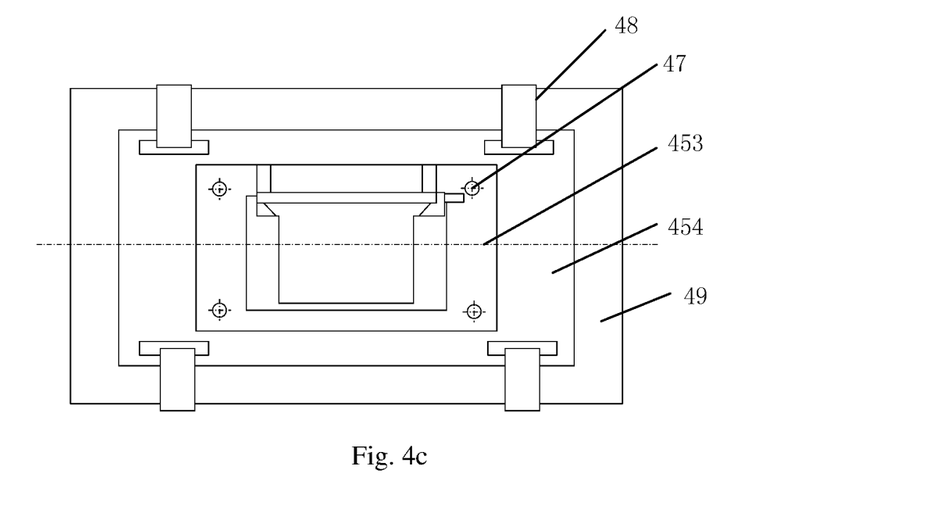
FIG. 4c is a top view of a pipeline-type fixture in accordance with the present application.

FIGS. 4a, 4b and 4c show a pipeline-type fixture. The pipeline-type fixture includes a second bracket 45, and fixing equipment for fixing the pipeline to be tested 49 under the second bracket 45. A pair of connecting members 451, 452 are spaced and oppositely disposed on the second bracket 45; and a space for accommodating and fixing the probe assembly unit 3 is formed between the pair of connecting members 451, 452. The assembly housing 32 of the probe assembly unit 3 is detachably and slidably coupled between the pair of connecting members 451, 452. The connecting members 451, 452 are specifically dovetail groove assemblies that slidably engage the trapezoidal guide rail 33 of the assembly housing 32. The desktop fixture further includes a locking mechanism for locking the assembly housing 32. Specifically, the locking mechanism includes locking handle 46 disposed on the second bracket 45 and one of the connecting member 452 and detachably coupled to the trapezoidal guide rail 33. The other connecting member 451 is fixedly connected to the second bracket 45. The fixing equipment specifically includes a strap 48 for attaching the pipeline to be tested 49 to the second bracket 45. When detecting the sample having a big diameter, the locking handle 46 is loosened, and the assembly housing 32 of the probe assembly unit 3 is inserted between the pair of connecting members 451 and 452 from top to bottom, and the trapezoidal guide rail 33 and the connecting member 451, 452 cooperate to each other to allow the assembly housing 32 to slide downward, thereby adjusting the distance between the probe 38 and the pipeline to be tested 49. After the adjustment is in place, the locking handle 46 is tightened to fix the probe assembly unit 3.

In a preferred manner, the second bracket 45 includes a verticality adjusting plate 453 and a bottom plate 454. The pair of connecting members 451 and 452 are disposed on the verticality adjusting plate 453, and the pipeline to be tested 49 is fixed on the bottom plate 454. The verticality adjusting plate 453 and the bottom plate 454 are movably connected by a plurality of mutually spaced screws 47. The angle of the bottom plate 454 relative to the verticality adjusting plate 453 can be adjusted by adjusting the height of each screw 47 between the verticality adjusting plate 453 and the bottom plate 454, respectively; the plurality of screws 47 are preferably located at four corners of the two plates, respectively. In addition, the verticality adjusting plate 453 and the bottom plate 454 are respectively opened with through holes through which the probe 38 passes to contact the sample to be tested below. The bottom plate 454 can also be provided with slots for the attachment of the straps 48.

In this embodiment, the calibration unit 5 provides the probe assembly with the functions of pressure calibration and thermoelectric potential calibration of the probe 38 in the calibration state. Correspondingly, the calibration unit 5 includes a force calibration assembly and a thermoelectric potential calibration assembly. The force calibration assembly is intended to read the loading force of the probe 38 to interpret the accuracy of the loading force; the thermoelectric potential calibration assembly is intended to determine if the thermoelectric potential measurement of the probe 38 is accurate.

Figure 5A:
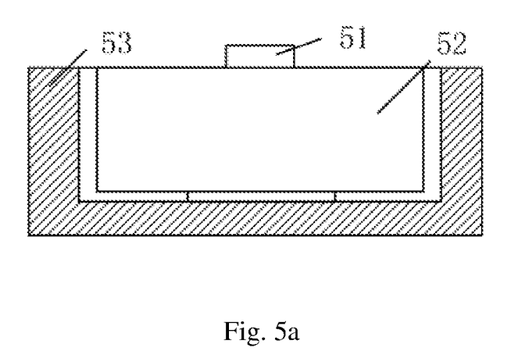
FIG. 5a is a cutaway view of a force calibration assembly in accordance with the present application.
Figure 5B:
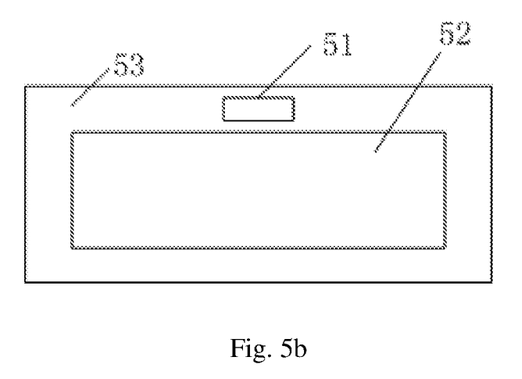
FIG. 5b is a top view of a force calibration assembly in accordance with the present application.

As shown in FIGS. 5a and 5b, the force calibration assembly includes a force sensor 52 for reading the loading force of the probe 38. The force sensor 52 is specifically disposed in a housing 53 provided with a plug 51 for connection with the probe assembly unit 3, and the plug 51 is specifically coupled to the connection socket 312 of the assembly housing 32. The force calibration assembly adopts an indirect calibration method, first calibrating the force sensor 52 with an external meter, and then connecting the plug 51 to the connecting socket 312 of the assembly housing 32, setting the loading current of the linear motor 35 of the probe assembly. That is, the loading force of the probe 38 is set, the display value of the force sensor 52 is read, and the loading force of the probe 38 is compared, and the accuracy of the loading force is determined.

Figure 6A:
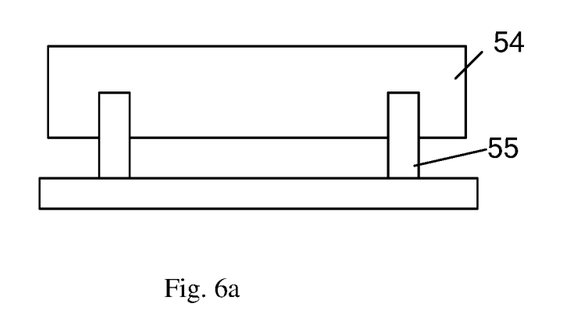
FIG. 6a is a front view of a thermoelectric potential calibration assembly in accordance with the present application.
Figure 6B:
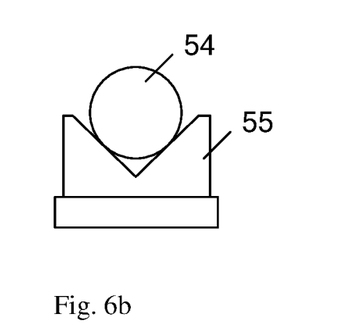
FIG. 6b is a side view of a thermoelectric potential calibration assembly in accordance with the present application.

As shown in FIGS. 6a and 6b, the thermoelectric potential calibration assembly includes a standard copper rod 54 that is the same material as the copper probe. The standard copper rod 54 is specifically disposed on a support 55. During the thermoelectric potential calibration, the probe assembly unit 3 is mounted on the above-mentioned desktop fixture, and the standard copper rod 54 is placed in the V-shaped groove of the support block 43, so that the probe 38 is extended and then contacted with the standard copper rod 54, and the obtained measurement is the thermoelectric potential in the system. The thermoelectric potential value should be a stable value. Before each measurement of the sample, the thermoelectric potential calibration assembly is measured to determine whether the thermoelectric potential measurement is stable.

Figure 7A:
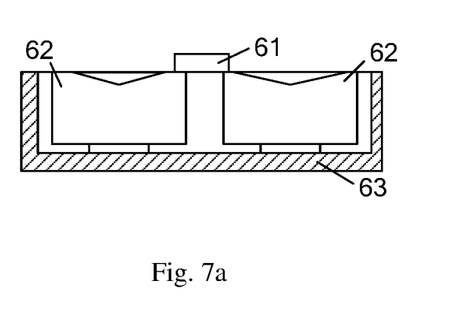
FIG. 7a is a cutaway view of a probe cooling unit in accordance with the present application.
Figure 7B:
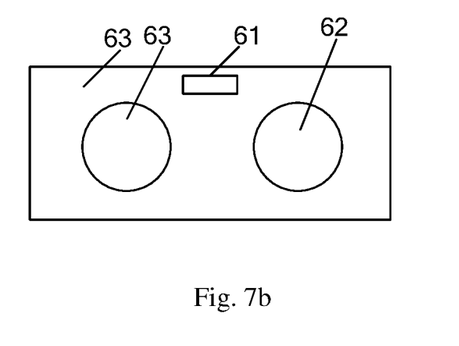
FIG. 7b is a top view of a probe cooling unit in accordance with the present application.

FIGS. 7a and 7b show the probe cooling unit 6 in this embodiment. The probe cooling unit 6 includes a shell 63, two cooling modules 62 disposed in the shell 63, and a plug 61 disposed on the shell 63. The two cooling modules 62 respectively correspond to the two probes 38 and grooves matching the lower portion of the copper probe are disposed on each cooling module 62 respectively. The plug 61 is used to connect the probe assembly unit 3, and is specifically coupled to the connecting socket 312 of the assembly housing 32. In the cooling state, the plug 61 is inserted into the connecting socket 312 of the assembly housing 32, the probe 38 is inserted into the groove of the corresponding cooling module 62, and fully fitted to supply power to the cooling module 62 to quickly cool the probe 38.

The following describes the working process of the portable thermoelectric potential detector described above, which in turn includes the following steps:

S1, making the thermoelectric potential detector in the calibration state for force calibration and thermoelectric potential calibration;

S101, performing force calibration; connecting the connecting socket 312 of the assembly housing 32 of the probe assembly unit 3 and the plug 51 of the force calibration component; setting the loading current of the two linear motors 35 through the collection and control unit 2, so that the probe 38 is loaded onto the force sensor 52 with a set loading force; reading the display value of the force sensor 52 to determine whether the loading force is accurate.

S102, performing the thermoelectric potential calibration; placing the standard copper rod 54 on the support block 43 of the desktop fixture, so that the probe 38 is extended and loaded onto the standard copper rod 54; measuring the thermoelectric potential value and determining whether it is a stable value to determine whether the thermoelectric potential measurement is stable.

S2, making the thermoelectric potential detector in a measuring state; fixing the sample to be tested on a desktop fixture or a pipeline-type fixture; measuring the thermoelectric potential of the sample to be tested.

S3, making the thermoelectric potential detector in a cooling state to cool the probe 38; specifically, connecting the plug 61 of the probe cooling unit 6 and the connecting socket 312 of the probe assembly unit 3; inserting the copper probe into the groove of the cooling module 62, and energizing the cooling module 62 to rapidly cool the copper probe.

Among them, S1, S2, and S3 are sequentially performed; the order of steps S101 and S102 can be interchanged.

Step S2 specifically includes:

S21, performing thermoelectric potential measurement on a small diameter component of the nuclear power field; or S22, performing thermoelectric potential measurement on a large diameter component of the nuclear power field.

Using the portable thermoelectric potential detector of the present application to perform thermoelectric potential detection on a small-diameter component (eg, a valve stem) of the nuclear power field (step S21) mainly includes the following steps:

S211, placing the sample to be tested on the V-shaped groove of the support block 43 of the desktop fixture;

S212, mounting the probe assembly unit 3 in the dovetail slot assembly of the desktop fixture; adjusting the distance between the probe assembly unit 3 and the sample to be tested, and tightening the locking handle;

S213, connecting the collection and control unit 2 and the cable between the probe assembly unit 3 and the computer 1;

S214, opening the computer 1; starting the test software, and starting testing.

Using the portable thermoelectric potential detector of the present application to perform thermoelectric potential detection on a large-diameter component (eg, a pipeline) of the nuclear power field (step S22) mainly includes the following steps:

S221, mounting the pipeline-type fixture on the outer wall of the pipe and securing it by the strap 48;

S222, mounting the probe assembly unit 3 in the dovetail slot assembly of the pipeline-type fixture; adjusting the distance between the probe assembly unit 3 and the outer surface of the pipe, and tightening the locking handle;

S223, connecting the collection and control unit 2 and the cable between the probe assembly unit 3 and the computer 1;

S224, opening the computer 1; starting the test software, and starting testing.

The portable thermoelectric potential detector provided by the application has the following advantages:

1, each unit is modular in design, small in size and easy to carry;

2, thermoelectric potential testing, thermoelectric potential calibration, probe pressure calibration, and probe cooling can be achieved through different combinations of units 3, two types of fixtures are available for different sizes of sample detecting.

The above embodiments are merely illustrative of the technical concept and feature of the present application, and are a preferred embodiment for the purpose of understanding the present application and the implementation of the present application. It is not intended to limit the scope of the application. Equivalent transformations or modifications made in accordance with the spirit of the application are intended to be covered by the scope of the present application.

The invention claimed is:

1. A portable thermoelectric potential detector, comprising a test fixture for fixing a sample to be tested, a probe assembly unit for detecting the sample to be tested, a collection and control unit for controlling detecting of the probe assembly and collecting a voltage signal of the probe assembly, and a probe cooling unit wherein, the probe assembly unit comprises two probe assemblies, each probe assembly includes a probe for loading on the surface of the sample to be tested and a linear motor for driving the probe to move and load on the surface of the sample to be tested; an output of the linear motor is connected to the probe;

the collection and control unit is electrically connected to the linear motor, and is further configured to transmit a first control signal for controlling a moving distance and a loading force of the linear motor; the collection and control unit controls a pressure of the probe on the sample to be tested by adjusting a current of the linear motor;

the probe cooling unit is removably connected with the probe assembly, and is configured for cooling the probe when the probe cooling unit is connected with the probe assembly; the probe cooling unit comprises a cooling module; the probe assembly is removably connected with the probe cooling unit.

2. The portable thermoelectric potential detector according to claim 1, wherein, the collection and control unit comprises an FPGA microprocessor.

3. The portable thermoelectric potential detector according to claim 1, wherein, the probe assembly further includes a heater for heating the probe and a temperature sensor for measuring a temperature of the probe;

the collection and control unit is electrically connected to the temperature sensor, and is further configured to receive temperature information measured by the temperature sensor, and send a second control signal for adjusting heating temperature to the heater according to the temperature information;

the heater is electrically connected to the collection and control unit, and is configured to adjust the heating temperature according to the second control signal.

4. The portable thermoelectric potential detector according to claim 1, wherein, the temperature sensor is a platinum electrode embedded in the probe.

5. The portable thermoelectric potential detector according to claim 1, wherein, the probe assembly unit includes an assembly housing, a motor mount fixedly disposed within the assembly housing; the linear motors of the two probe assemblies are disposed on the motor mount respectively, the probes of the two probe assemblies have a minimum pitch of 40 mm.

6. The portable thermoelectric potential detector according to claim 5, wherein, the test fixture includes a desktop fixture for fixing a sample with a small diameter;

the desktop fixture includes a first bracket, a pair of connecting members disposed on the first bracket, the assembly housing is detachably and slidably coupled between the pair of connecting members disposed on the first bracket.

7. The portable thermoelectric potential detector according to claim 6, wherein, the desktop fixture further includes a support block fixedly disposed on the first bracket, a groove for placing the sample to be tested is opened on the support block.

8. The portable thermoelectric potential detector according to claim 5, wherein, the test fixture includes a pipeline-type fixture for fixing a sample with a large diameter; the pipeline-type fixture includes a second bracket, a pair of connecting members disposed on the second bracket, the assembly housing is detachably and slidably coupled between the pair of connecting members disposed on the second bracket.

9. The portable thermoelectric potential detector according to claim 8, wherein, the pipeline-type fixture includes a fixing equipment for fixing the sample to be tested under the second bracket; the second bracket includes a verticality adjusting plate and a bottom plate; the fixing equipment is connected with the bottom plate; the verticality adjusting plate and the bottom plate are movably connected by a plurality of mutually spaced screws.

10. The portable thermoelectric potential detector according to claim 1, wherein, the portable thermoelectric potential detector further includes a calibration unit for performing thermoelectric potential calibration and pressure calibration to the probe assembly; the probe assembly is removably connected with the calibration unit; when the probe assembly is connected with the calibration unit, the probe assembly is in a calibration state.

11. The portable thermoelectric potential detector according to claim 10, wherein, the calibration unit includes a force calibration assembly and a thermoelectric potential calibration assembly; the force calibration assembly includes a force sensor, which has a plug connected with a socket on the bottom of the probe assembly; the thermoelectric potential calibration assembly includes a standard copper rod, a material of which is the same as that of the probe.

\* \* \* \* \*